(12) United States Patent
Rimbert-Riviere et al.

(10) Patent No.: US 12,390,887 B2
(45) Date of Patent: Aug. 19, 2025

(54) METHOD FOR SEPARATING SUBSTRATES

(71) Applicant: Infineon Technologies AG, Neubiberg (DE)

(72) Inventors: Charles Rimbert-Riviere, Soest (DE); Sven Buchholz, Dortmund (DE)

(73) Assignee: Infineon Technologies AG, Neubiberg (DE)

( * ) Notice: Subject to any disclaimer, the term of this patent is extended or adjusted under 35 U.S.C. 154(b) by 428 days.

(21) Appl. No.: 17/734,205

(22) Filed: May 2, 2022

(65) Prior Publication Data

US 2022/0355418 A1 Nov. 10, 2022

(30) Foreign Application Priority Data

May 7, 2021 (EP) ..................................... 21172725

(51) Int. Cl.
*B23K 26/38* (2014.01)
*B23K 26/402* (2014.01)
*B23K 103/00* (2006.01)
*H01L 21/48* (2006.01)

(52) U.S. Cl.
CPC ............ *B23K 26/38* (2013.01); *B23K 26/402* (2013.01); *B23K 2103/52* (2018.08); *H01L 21/4807* (2013.01)

(58) Field of Classification Search
CPC .. B23K 26/38; B23K 26/402; B23K 2103/52; H01L 21/4807
See application file for complete search history.

(56) References Cited

U.S. PATENT DOCUMENTS

| | | |
|---|---|---|
| 5,379,942 A | 1/1995 | Kuhnert et al. |
| 2013/0291597 A1 | 11/2013 | Saito et al. |
| 2015/0209898 A1 | 7/2015 | Kim et al. |
| 2016/0254209 A1 | 9/2016 | Oohiraki et al. |
| 2017/0008122 A1 | 1/2017 | Wieland et al. |
| 2019/0009361 A1 | 1/2019 | Xu et al. |

FOREIGN PATENT DOCUMENTS

| | | | |
|---|---|---|---|
| CN | 107538137 | * | 1/2015 |
| JP | H081588 A | | 1/1996 |
| JP | 2008198905 A | | 8/2008 |

OTHER PUBLICATIONS

Ji, Lingfei , et al., "Crack-free cutting of thick and dense ceramics with CO2 laser by single-pass process", Optics and Lasers in Engineering, vol. 46, Issue 10, Oct. 2008, pp. 785-790.

* cited by examiner

*Primary Examiner* — Mathieu D Vargot
(74) *Attorney, Agent, or Firm* — Murphy, Bilak & Homiller, PLLC

(57) ABSTRACT

A method includes forming a plurality of perforations in a ceramic mastercard by a first laser process, wherein forming the plurality of perforations includes reducing a first thickness of the ceramic mastercard to a second thickness along first predefined lines, and cutting through an entire thickness of the ceramic mastercard along a plurality of second predefined lines by a second laser process, wherein the first predefined lines and the second predefined lines overlap only partly.

12 Claims, 5 Drawing Sheets

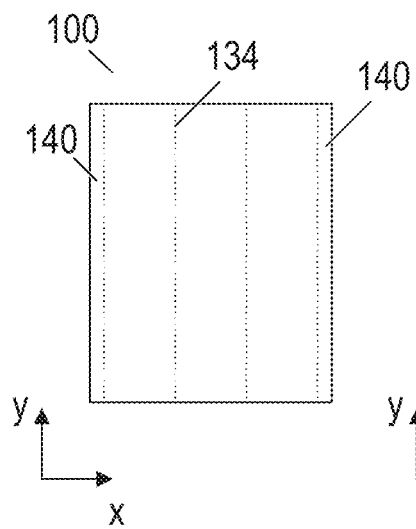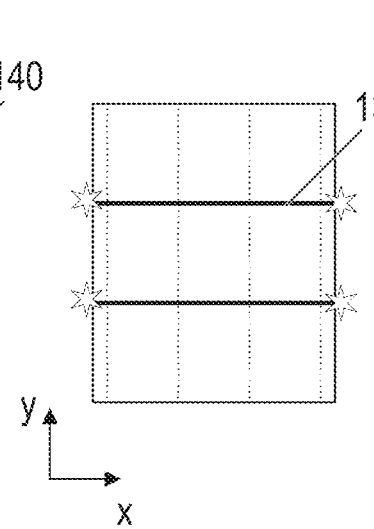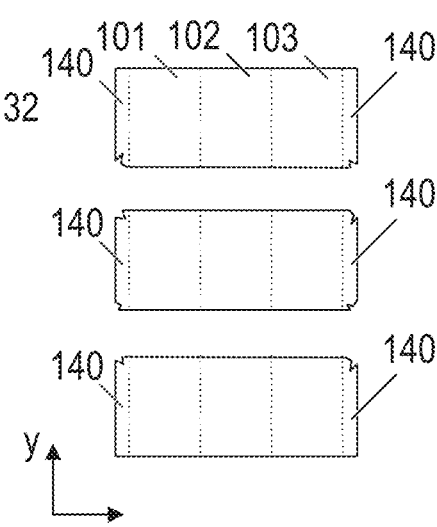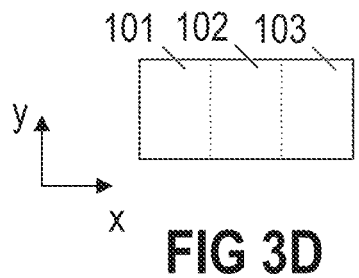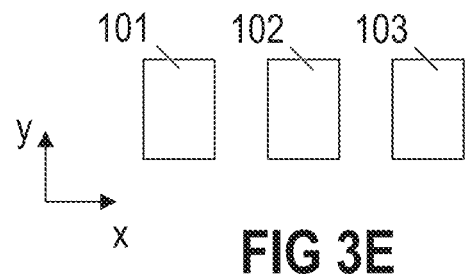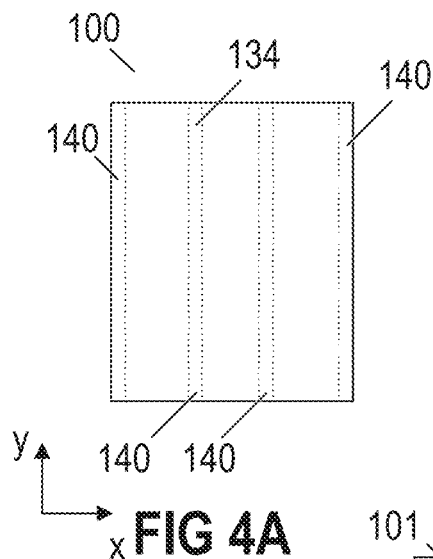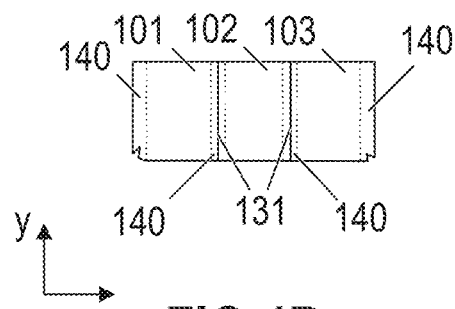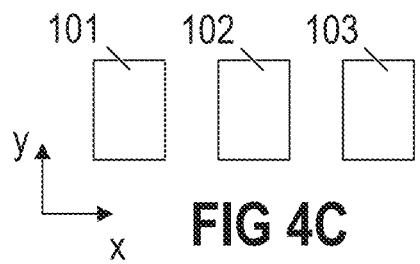

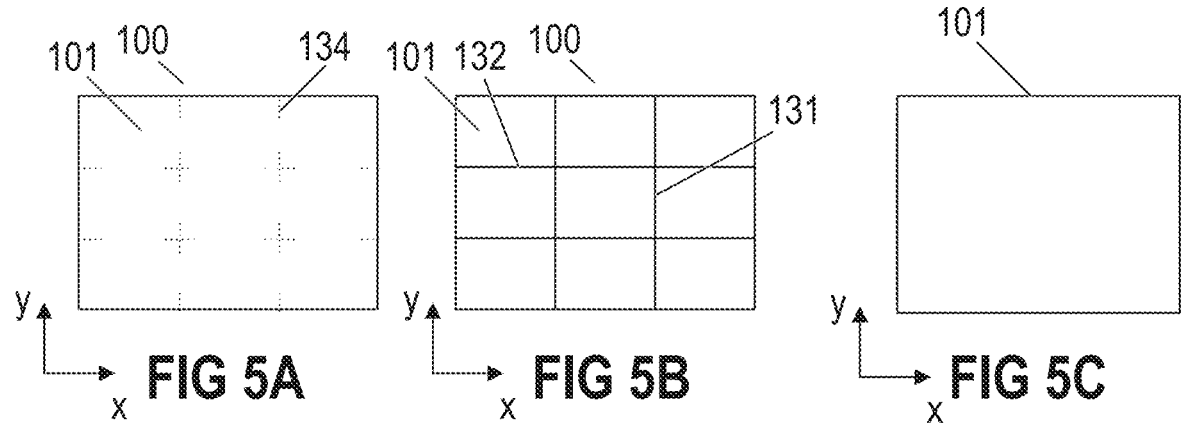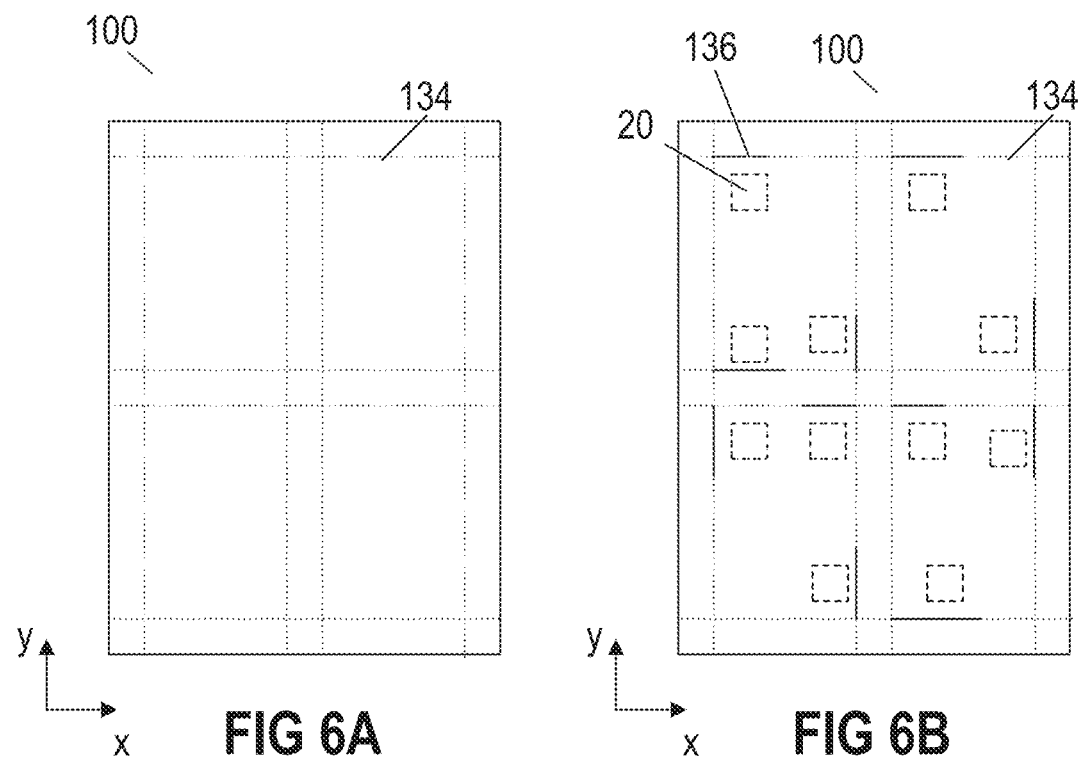

METHOD FOR SEPARATING SUBSTRATES

TECHNICAL FIELD

The instant disclosure relates to a method for separating substrates from a single mastercard, in particular for separating several ceramic substrates from a single ceramic mastercard.

BACKGROUND

Substrates such as, e.g., ceramic substrates, are often used in power semiconductor modules. Such substrates comprise a dielectric insulation layer and at least one metallization layer attached to the dielectric insulation layer. The dielectric insulation layer may be a ceramic layer. Individual dielectric insulation layers (substrates) are usually obtained by dividing a large mastercard into a plurality of separate substrates. There is a risk, however, that the individual substrates get damaged during the separation step. In particular, uncontrolled breaking of the ceramic along the edges may occur, which may result in cracks, microcracks, or chipping, for example. Such damages may negatively affect the performance of the power semiconductor module in which the damaged substrate is included.

There is a need for a method for separating ceramic substrates, with which damages can be reduced or even avoided.

SUMMARY

A method includes forming a plurality of perforations in a ceramic mastercard by a first laser process, wherein forming the plurality of perforations includes reducing a first thickness of the ceramic mastercard to a second thickness along first predefined lines, and cutting through an entire thickness of the ceramic mastercard along a plurality of second predefined lines by a second laser process, wherein the first predefined lines and the second predefined lines overlap only partly.

A method includes heating a ceramic mastercard from a first temperature, at which the ceramic mastercard is curved, to a second temperature, at which the ceramic mastercard is flat, and cutting through the entire thickness of the ceramic mastercard along a plurality of predefined lines by a laser process, thereby dividing the ceramic mastercard into a plurality of separate substrates.

A method includes pressing a curved ceramic mastercard flat on a first surface by a holding device, and cutting through the entire thickness of the ceramic mastercard along a plurality of predefined lines by a laser process, thereby dividing the ceramic mastercard into a plurality of separate substrates, wherein the holding device presses on the ceramic mastercard in defined holding areas, wherein the defined holding areas are areas of the ceramic mastercard which are subject to a higher stress and/or a greater bow than other areas of the ceramic mastercard.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 3A to 3E schematically illustrate a method for separating substrates according to another example.

FIGS. 4A to 4C schematically illustrate a method for separating substrates according to another example.

FIGS. 5A to 5C schematically illustrate a method for separating substrates according to another example.

FIGS. 6A and 6B schematically illustrate a method for separating substrates according to another example.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
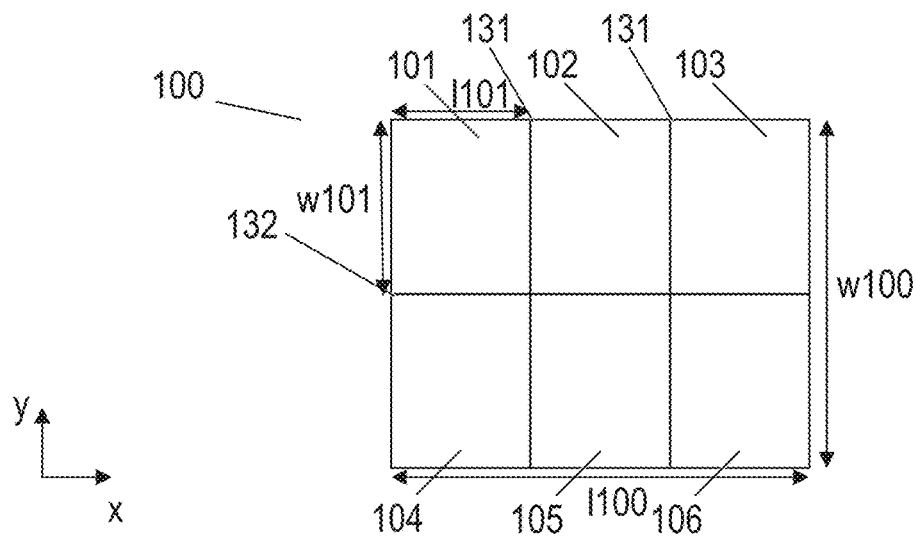
FIG. 1 schematically illustrates a mastercard from which several substrates can be separated.

Referring to FIG. 1, a so-called mastercard or panel 100 is schematically illustrated. The mastercard 100 can be divided into a plurality of separate substrates 101-106. The overall size of the mastercard 100 can be several times the size of a single substrate 101-106. In the example illustrated in FIG. 1, the mastercard 100 can be divided into six separate substrates 101-106. This, however, is only an example. It is possible that a mastercard 100 can be divided into more than six or less than six individual substrates. The individual substrates 101-106 often have a rectangular cross-section. The mastercard 100 can also have a rectangular cross-section. Other cross-sections for the substrates 101-106 and for the mastercard 100, however, are also possible such as square, round or oval, for example.

According to one example, a length l100 of the mastercard 100 in a first horizontal direction x can be several times the length l101 of a single substrate 101 in the same direction, and a width w100 of the mastercard 100 in a second horizontal direction y perpendicular to the first horizontal direction x can be several times the width w101 of a single substrate 101 in the same direction. The length l101 of a single substrate 101 can be between 4 mm and 102 mm, and the width w101 of a single substrate 101 can be between 4 mm and 60 mm, for example. Other dimensions of the substrates, however, are also possible.

A substrate 101-106 generally includes a dielectric insulation layer, a (structured) first metallization layer attached to the dielectric insulation layer, and a (structured) second metallization layer attached to the dielectric insulation layer. The dielectric insulation layer is disposed between the first and second metallization layers. The second metallization layer generally is optional and can be omitted.

Each of the first and second metallization layers can consist of or include one of the following materials: copper; a copper alloy; aluminum; an aluminum alloy; any other metal or alloy that remains solid during the operation of the power semiconductor arrangement. The substrate 101-106 can be a ceramic substrate, that is, a substrate in which the dielectric insulation layer is a ceramic, e.g., a thin ceramic layer. The ceramic can consist of or include one of the following materials: aluminum oxide; aluminum nitride; zirconium oxide; silicon nitride; boron nitride; or any other dielectric ceramic. For example, the dielectric insulation layer can consist of or include one of the following materials: $Al_2O_3$, AlN, SiC, BeO or $Si_3N_4$. For instance, the substrate 101-106 may be, e.g., a Direct Copper Bonding (DCB) substrate, a Direct Aluminum Bonding (DAB) substrate, or an Active Metal Brazing (AMB) substrate. Further, the substrate can be an Insulated Metal Substrate (IMS). An Insulated Metal Substrate generally comprises a dielectric insulation layer comprising (filled) materials such as epoxy resin or polyimide, for example. The material of the dielectric insulation layer can be filled with ceramic particles, for example. Such particles can comprise, e.g., $Si_2O$, $Al_2O_3$, AlN, or BN and can have a diameter of between about 1 μm and about 50 μm.

Substrates such as, e.g., ceramic substrates, are often used in power semiconductor modules. That is, one or more semiconductor components can be arranged on the substrate, e.g., on the first metallization layer. The at least one metallization layer can be formed on the dielectric insulation layer either before or after dividing the mastercard 100 into separate substrates 101-106.

There is a risk, however, that the individual substrates 101-106 get damaged during the separation step. In particular, uncontrolled breaking of the ceramic along the edges may occur, which may result in cracks, microcracks, or chipping, for example. Such damages may negatively affect the performance of the power semiconductor module in which the damaged substrate is included.

Figure 10:
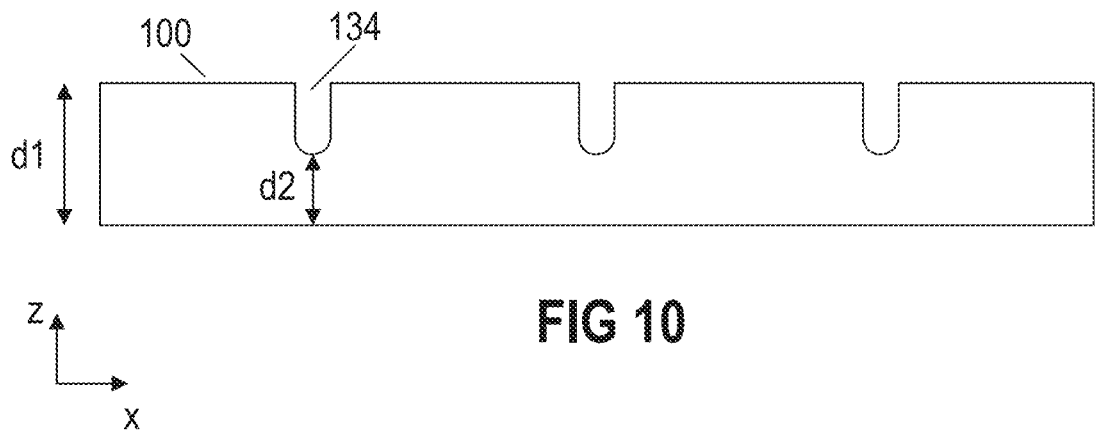
FIG. 10 schematically illustrates a cross-sectional view of a mastercard before separating the mastercard into several separate substrates.

In order to reduce or even avoid damages occurring when dividing the mastercard 100 into a plurality of separate substrates 101-106, a plurality of perforations 134 is generated in the ceramic mastercard 100 by means of a first laser process (e.g., laser scribing). Generating the plurality of perforations 134 comprises reducing a first thickness d1 of the ceramic mastercard 100 along first predefined lines. Perforations 134 are schematically illustrated in FIG. 10, which illustrates a cross-sectional view of a mastercard 100. As is illustrated in FIG. 10, the mastercard 100 comprises a first thickness d1 in a vertical direction z that is perpendicular to the first horizontal direction x and the second horizontal direction y. This first thickness d1 can be locally reduced to form the perforations 134. That is, the first thickness d1 of the mastercard 100 can be locally reduced to a second thickness d2 which is less than the first thickness d1. According to one example, the second thickness d2 is between 50% and 90% of the first thickness d1. The first thickness d1 can be between 200 μm and 1000 μm, for example.

A subsequent step comprises cutting through the entire thickness d1 of the mastercard 100 along a plurality of second predefined lines by means of a second laser process. The plurality of first predefined lines and the plurality of second predefined lines overlap only partly. This will be described with respect to different examples in the following.

Figures 2A, 2B, 2C:
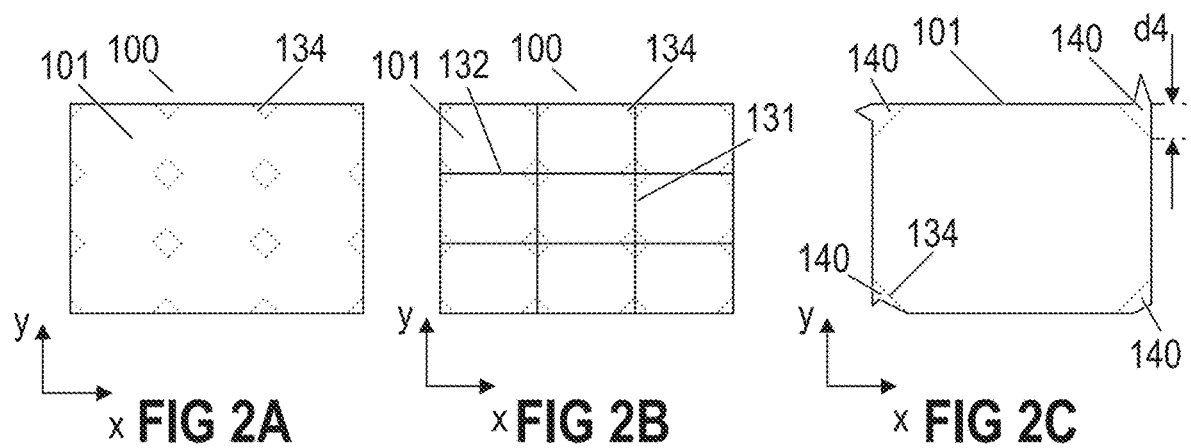
FIGS. 2A to 2D schematically illustrate a method for separating substrates according to one example.

Now referring to FIGS. 2A through 2D, a method for dividing a mastercard 100 into a plurality of separate substrates according to one example is schematically illustrated. As is schematically illustrated in FIG. 2A, a plurality of perforations 134 is generated in the ceramic mastercard 100 by means of a first laser process. The perforations 134 are illustrated by means of dotted lines in FIG. 2A. As can be seen, for example, in FIG. 2B which illustrates the second step of cutting through the entire thickness d1 of the mastercard 100 along a plurality of second predefined lines 132, 131 by means of a second laser process, the perforations 134 in this example are formed to separate the corners of the individual substrates 101-106 from a main body of the respective substrate 101-106. Damages of the ceramic material often occur close to the corners of the individual substrates 101-106. This is schematically illustrated in FIG. 2C, which shows one individual substrate 101 after dividing the mastercard 100 into a plurality of separate substrates 101-106. In the areas close to the corners of the substrate 101, damages are schematically illustrated. The areas close to the corners, which are separated from the main body by means of the perforations 134, in this example form sacrificial areas 140. A distance d4 between the respective corner and the point at which a perforation 134 intersects with the edge of the resulting substrate 101 can be 100 μm or more, for example. According to one example, the distance d4 between the respective corner and the point at which a perforation 134 intersects with the edge of the resulting substrate 101 is 400 μm or more, or even 750 μm or more.

The cuts 131, 132, which cut through the entire thickness d1 of the mastercard 100 in order to separate the individual substrates 101-106, are formed along the edges of the resulting substrates 101-106. That is, the major part of the cuts 131, 132 is formed in areas of the mastercard 100, in which the thickness d1 is the first thickness d1. In such areas the second predefined lines do not intersect with the perforations 134. However, the cuts 131, 132 intersect with the perforations 134 in those areas, where the perforations 134 reach the edges of the individual substrates 101-106. That is, the cuts 131, 132 at least partly extend through areas of the mastercard 100, in which the thickness is reduced to the second thickness d2. And the first predefined lines (perforations 134) only partly overlap with the second predefined lines 131, 132.

Figure 2D:
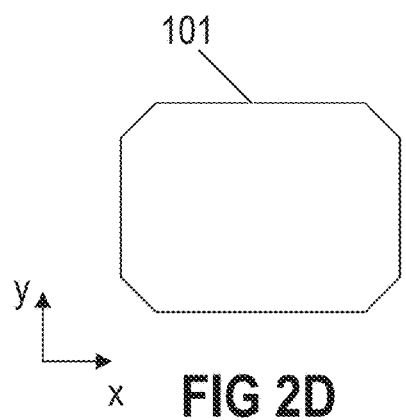

The sacrificial areas 140 are removed in a subsequent step after the individual substrates 101-106 have been separated, thereby also removing the damaged parts of the substrate 101. One substrate 101 after the removal of the corners (sacrificial areas 140) is schematically illustrated in FIG. 2D. The resulting substrates 101-106, therefore, are free of damages, as the damages are removed together with the sacrificial areas. In some examples, it is possible that not all of the damages occur in the range of the sacrificial areas. However, the majority of damages may still be removed when removing the sacrificial areas 140. The remaining damages may be negligible and may not significantly affect the performance of the power semiconductor module in which the substrate 101-106 is included.

Forming sacrificial areas 140 in the range of the corners of an angular substrate 101-106, however, is only an example. According to another example, and as is schematically illustrated in FIGS. 3A-3E and 4A-4C, it is also possible to form sacrificial areas 140 along one or more edges of at least some of the resulting substrates 101-106, for example. As is schematically illustrated in the example of FIG. 3A, a plurality of perforations 134 is generated in the ceramic mastercard 100 by means of a first laser process, wherein the perforations 134 extend along those edges of the resulting individual substrates 101-106 which extend in the second horizontal direction y. In the example illustrated in FIGS. 3A through 3E, sacrificial areas 140 are formed along the longitudinal sides of the rectangular mastercard 100. It is, however, also possible to instead form sacrificial areas 140 along the narrow sides of a rectangular mastercard 100, or along any two opposite sides of a square mastercard 100, for example. The cuts 132 which are formed in the subsequent step (FIG. 3B), are formed along lines that extend perpendicular to the perforations 134. That is, the cuts 132 are made along second lines which intersect with the perforations 134 at a right angle (90°).

As is illustrated in FIG. 3C, this results in a plurality of strips of connected substrates. In the example illustrated in FIGS. 3A through 3E, the mastercard 100 is divided into nine separate substrates. Each strip of substrates comprises three substrates. As is illustrated in FIG. 3B, there is also a high risk of damages occurring in those areas, where the cuts 132 meet the edges of the mastercard 100 (illustrated by means of stars in FIG. 3B). The resulting damages are exemplarily illustrated in FIG. 3C. The sacrificial areas 140 are subsequently removed, thereby also removing the damages that occurred during the second laser process used for cutting through the mastercard 100. A strip including three substrates 101, 102, 103 which is free of damages (sacrificial areas 140 removed), is schematically illustrated in FIG. 3D. In a subsequent step, the resulting strips can be divided into separate substrates 101, 102, 103. According to one example, this step may comprise breaking the resulting strips of the mastercard 100 along the remaining perforations 134. According to another example, it is also possible to perform a third laser process in which a laser cuts through the entire thickness of the mastercard 100 along the course of the remaining perforations 134 in order to separate the individual substrates 101, 102, 103.

In the example illustrated in FIGS. 3A through 3E, sacrificial areas 140 are only formed along two of the edges of the mastercard 100. As is schematically illustrated in FIGS. 4A through 4C, it is also possible to form additional sacrificial areas 140 between the individual substrates. In FIG. 4A, the step of forming the perforations 134 by means of a first laser process is schematically illustrated. The sacrificial areas 140 along two of the edges of the mastercard 100 correspond to the sacrificial areas 140 that have been described with respect to FIGS. 3A through 3E above. Additional sacrificial areas 140 are formed, which extend along the edges separating the individual substrates from each other. The step of cutting through the entire thickness of the mastercard 100 by means of a second laser process corresponds to the step as has been described with respect to FIG. 3B above and is not specifically illustrated in FIGS. 4A through 4C. In FIG. 4B, a resulting strip of substrates 101, 102, 103 is schematically illustrated, similar to what has been illustrated in FIGS. 3C and 3D above. In a subsequent step, the individual substrates 101, 102, 103 can be separated. For example, a further laser process may be performed, thereby cutting through the entire thickness of the divided mastercard 100 in a direction parallel to the perforations 134. The additional cuts 131 are schematically illustrated in FIG. 4B. If further damages occur during this step, such damages will subsequently be removed when the additional sacrificial areas 140 are removed. The resulting separated substrates 101, 102, 103 are schematically illustrated in FIG. 4C.

In the examples illustrated by means of FIGS. 3A-3E and 4A-4C, the sacrificial areas 140 have the shape of stripes. A width of such stripes in the first horizontal direction x can be 100 µm or more, 400 µm or more, or 750 µm or more, for example. A certain minimum width of the sacrificial areas 140 may be required to ensure that all, or at least most of the damages occur in the sacrificial areas 140 and are removed when removing the sacrificial areas.

As can be seen from the above, sacrificial areas 140 can be formed in any suitable areas of the mastercard 100 by means of perforations 134. The areas of the mastercard 100 which form sacrificial areas 140 may be those areas, in which all or at least a majority of the damages are expected. This may depend on many different factors such as the material of the mastercard 100, the size of the mastercard 100, the number of substrates to be separated from the mastercard 100, the size and form of the substrates to be separated from the mastercard 100, and the first thickness d1 of the mastercard 100, for example. When cutting through the entire thickness d1 of the mastercard 100 to separate the substrates, the cuts may be formed along defined lines which do not entirely correspond to the perforations 134, but which intersect or partly overlap with the perforations 134.

Creating sacrificial areas 140 and removing damages by removing the sacrificial areas 140 after dividing a mastercard 100 into individual substrates, however, is only one example. According to another example, perforations 134 are formed in a preceding step before cutting through the entire thickness of the mastercard 100 to separate the individual substrates, in order to avoid or at least reduce the formation of damages. This is exemplarily illustrated in FIGS. 5A through 5C. As is illustrated in FIG. 5A, perforations 134 can be formed in areas, in which all, or at least most of the damages are expected. This can be in the range of the corners of the resulting individual substrates, for example. When the mastercard 100 is subsequently divided into a plurality of separate substrates by means of a second laser process, the predefined lines along which the cuts 131, 132 are formed can partly overlap with the lines along which the perforations 134 are formed.

As is illustrated in FIG. 5B, the predefined lines along which the cuts 131, 132 are formed correspond to the edges of the resulting individual substrates. As the perforations are formed in a preceding step in those areas, where all or at least most of the damages are expected, the tensions in the material in the affected areas are reduced. When the laser cuts through those highly affected areas with the perforations 134, less damages occur in those areas. In FIG. 5C, a resulting single substrate 101 without significant damages is schematically illustrated. In this case, there is no need to remove any sacrificial areas, as damages have been avoided instead.

Forming perforations in the range of the corners of the resulting substrates, however, is only an example. Generally speaking, perforations are formed in those areas, where all or at least most of the damages are expected. The areas which are most prone to damages can be different for different substrates. The areas, for example, can depend on the material of the mastercard 100, the size of the mastercard 100, the number of substrates to be separated from the mastercard 100, the size and form of the substrates to be separated from the mastercard 100, and the first thickness d1 of the mastercard 100, for example. Alternatively, it is also possible to form perforations 134 in areas which are most critical during the use of the semiconductor arrangement that is to be formed on the respective substrate.

According to an even further example, which is schematically illustrated in FIGS. 6A and 6B, perforations 134 can be formed along the entire circumference of the resulting individual substrates (see, e.g., FIG. 6A). In a subsequent step, a second laser process may be used to cut through the entire thickness of the mastercard 100 along defined lines 136 which extend partly along the circumference of the resulting individual substrates, but not along the entire circumference of the resulting individual substrates. As is exemplarily illustrated in FIG. 6B, a laser process may be used to cut through the entire thickness of the mastercard 100 only along defined lines 136. For example, the laser may cut through the entire thickness of the mastercard 100 in areas which are most prone to damages during a breaking process, or in areas which are subject to a high stress. Areas which are subject to a high stress can be areas close to the positions at which components (e.g., semiconductor bodies 20) are arranged to form a semiconductor arrangement. A clean cut may be formed in this way, without separating the entire substrates. The separation may take place in a subsequent step (not specifically illustrated), which may be a breaking step, for example. That is, the mastercard 100 may be broken along the perforations 134, in order to separate the individual substrates. The ceramic of the mastercard 100 usually breaks cleanly along the perforations. Damages, however, may occur in certain areas along the circumference of the substrates. As these areas have already been cut in the preceding laser step, the occurrence of damages can be reduced or even avoided.

In the examples described by means of FIGS. 2A to 6B above, a plurality of perforations 134 is formed in a ceramic mastercard 100 by means of a first laser process, wherein forming the plurality of perforations 134 comprises reducing a thickness d1 of the ceramic mastercard 100 to a second thickness d2 along first predefined lines. In a subsequent step, a second laser process is performed to cut through the entire thickness d1 of the ceramic mastercard 100 along a plurality of second predefined lines. The first predefined lines and the second predefined lines intersect or overlap partly (but not entirely). As the first predefined lines and the second predefined lines overlap only partly, the method can be implemented in a fast and, therefore, cost-effective way. In a case in which the first predefined lines overlap entirely with the second predefined lines, the perforations are, e.g., formed along the entire circumference of the plurality of separate substrates. The final cuts with which the separation of the substrates is performed in this case would also be formed around the entire circumference of the plurality of individual substrates. Both steps, therefore, require a large amount of time. In contrast, according to the examples described above, at least one of the steps can be performed in less time. More substrates, therefore, can be separated in a given period of time, which reduces the overall costs of the process, while reducing or even avoiding the occurrence of damages during the process.

Figure 7A:
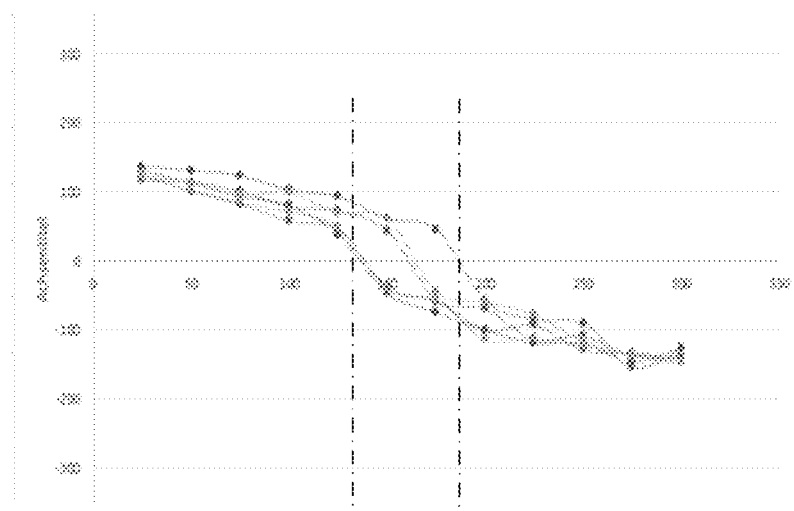
FIGS. 7A and 7B schematically illustrate a method for separating substrates according to another example.
Figure 7B:
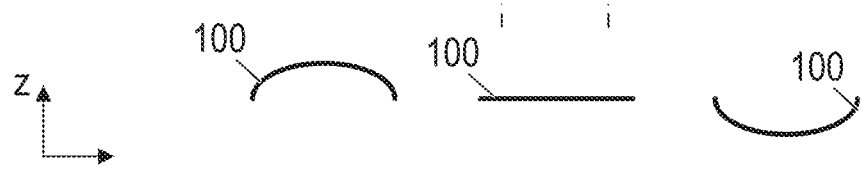

Damages of the individual substrates 101-106, alternatively, can be prevented or at least reduced by means of an even further method which is schematically illustrated by means of FIGS. 7A and 7B. Mastercards 100 usually have a certain bow. That is, the mastercard 100 has a curved form instead of being entirely flat. A bow may result from the process that is used to produce the mastercard. A curved mastercard 100 is schematically illustrated in FIG. 7B, left side. A laser process for dividing the mastercard 100 into a plurality of separate substrates 101-106 is usually performed at comparably low temperatures, e.g., at room temperature. As is illustrated in FIG. 7A in combination with FIG. 7B, most mastercards 100 are curved at comparably low temperatures, e.g., at temperatures below 130° C. The mastercard 100 can have a convex form at temperatures below a certain first threshold temperature (see FIG. 7B left side). The bow may become less, as the mastercard 100 is heated to temperatures above the first threshold temperature. At a certain temperature which is higher than the first threshold temperature, the mastercard 100 may be entirely flat (see FIG. 7B middle). The mastercard 100 may be flat at temperatures of between 150° C. and 170° C., for example. This temperature, however, may depend on the material, the size and/or other properties of the mastercard 100. If the mastercard 100 is heated even more, to above a certain second threshold temperature, the mastercard may have a concave form (See FIG. 7B, right side).

A method for separating a mastercard 100 into a plurality of separate substrates 101-106 comprises heating the ceramic mastercard 100 from a first temperature, at which the ceramic mastercard 100 is curved, to a second temperature, at which the ceramic mastercard 100 is flat. A subsequent step, performed at the second temperature, comprises cutting through the entire thickness d1 of the ceramic mastercard 100 along a plurality of predefined lines by means of a laser process, thereby dividing the ceramic mastercard 100 into a plurality of separate substrates. The mastercard is prone to damages during the separation step, if it has a significant bow. If the mastercard 100 is curved, there are significant internal tensions in the material which may facilitate the formation of damages when the separate substrates 101-106 are cut from the mastercard 100. The tensions are reduced or even prevented when the mastercard is flat during the step of dividing it into individual substrates. Therefore, no, or at least less damages occur when the mastercard 100 is heated to a temperature at which it is flat, and performing the separation step while the mastercard 100 is flat.

Figure 8:
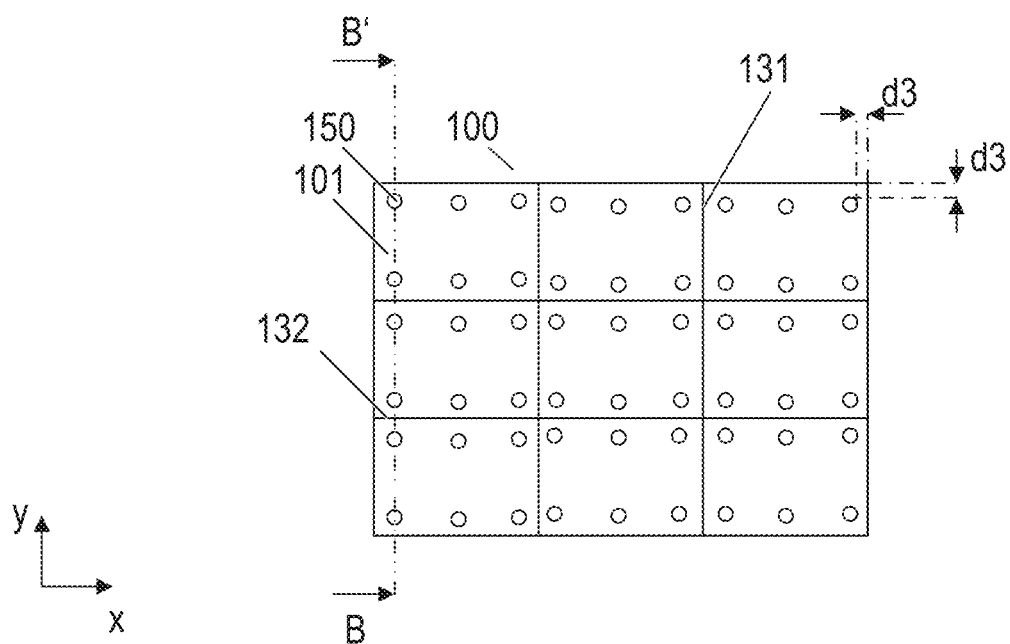
FIG. 8 schematically illustrates a method for separating substrates according to another example.
Figure 9A:
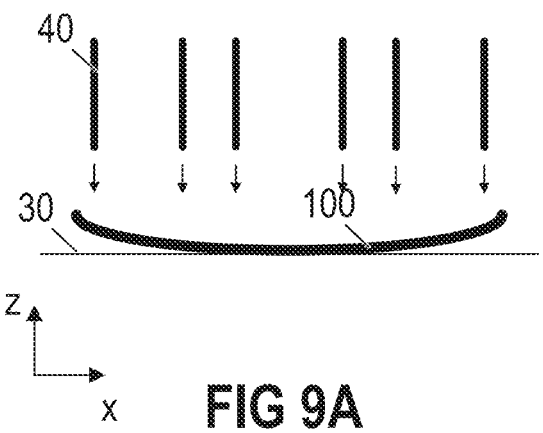
FIGS. 9A and 9B schematically illustrate a method for separating substrates according to the example of FIG. 8.
Figure 9B:
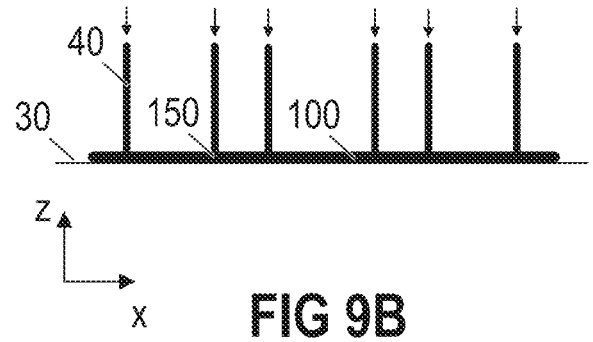

According to an even further example which is schematically illustrated in FIGS. 8 and 9A-9B, a curved mastercard 100 can be pressed flat on a first surface 30 by means of a holding device 40. In this way, a bow of the mastercard 100 is removed. Clear cuts can then be made when cutting through the entire thickness d1 of the ceramic mastercard 100 along a plurality of predefined lines by means of a laser process, thereby dividing the mastercard 100 into a plurality of separate substrates 101-106. The holding device 40 presses on the mastercard 100 in defined holding areas 150, wherein the defined holding areas 150 are areas of the mastercard 100 which are subject to a higher stress and/or a greater bow than other areas of the mastercard 100. By holding down the mastercard 100 and pressing it flat against the first surface 30 according to the method illustrated by means of FIGS. 8 and 9A-B, a spring back effect is reduced or even completely avoided. Generally, when pressing the curved mastercard 100 against the flat surface 30, great forces can occur which try to bring the mastercard 100 back in its curved form. When the mastercard 100 is cut by means of a laser, such a spring back effect generally may occur most likely, when a major part of the predefined lines has already been cut and different neighboring substrates 101-106 are only still held together by comparably small bars of ceramic material. It may then happen that before the cutting is completed, the mastercard springs back into its curved form, uncontrollably tearing off the remaining connections between the separate substrates 101-106. This may introduce severe damage to the substrates 101-106.

By holding down the mastercard 100 in defined holding areas 150, wherein the defined holding areas 150 are areas of the mastercard 100 which are subject to a higher stress and/or a greater bow than other areas of the mastercard 100, the spring back effect can be reduced or even avoided, thereby reducing or avoiding damages of the resulting substrates 101-106. Those areas of the mastercard 100 which are subject to a higher stress and/or a greater bow than other areas of the mastercard 100 are generally most prone to the spring back effect and resulting damages. Several different exemplary holding areas 150 are schematically illustrated in the top view of a mastercard 100 of FIG. 8. According to one example, each of the holding areas 150 may be arranged in a corner of one of the resulting individual substrates, at a distance d3 of between 200 µm and 500 µm from the respective edges. Additional holding areas 150, for example, can be arranged centrally between the corners along the edges of the resulting individual substrates.

What is claimed is:

1. A method for separating substrates, comprising:
    forming a plurality of perforations in a ceramic mastercard by a first laser process, wherein forming the plurality of perforations comprises reducing a first thickness of the ceramic mastercard to a second thickness along first predefined lines; and
    after forming the plurality of perforations, separating the mastercard into multiple parts by cutting through an entire thickness of the ceramic mastercard along a plurality of second predefined lines by a second laser process, wherein one or more of the second predefined lines intersects with one or more of the perforations,
    wherein each of the multiple parts of the mastercard forms one of a plurality of separate substrates or is configured to be further divided into two or more separate substrates, and
    wherein one or more sacrificial areas remain attached to each of at least a subset of the plurality of separate substrates, wherein each sacrificial area is separated from a main body of a respective separate substrate by one or more of the perforations.

2. The method of claim 1, further comprising detaching the one or more sacrificial areas from the main bodies of one or more of the separate substrates.

3. The method of claim 2, wherein the detaching of the one or more sacrificial areas from the main body of the respective substrates comprises a breaking process along the perforations.

4. The method of claim 1, wherein each of the sacrificial areas is formed in a corner of the respective one of the plurality of separate substrates.

5. The method of claim 1, wherein each of the sacrificial areas is formed along an edge of at least one of the plurality of separate substrates.

6. The method of claim 5, wherein each of the sacrificial areas is formed in a form of a stripe having a width in a first horizontal direction of 750 µm or more.

7. The method of claim 1, wherein the mastercard is separated into a plurality of separate substrates, wherein each of the plurality of separate substrates has a rectangular cross-section, and wherein the perforations are formed in a range of the corners of the resulting individual substrates.

8. The method of claim 7, wherein the second predefined lines correspond to the edges of the resulting individual substrates.

9. The method of claim 1, wherein the mastercard is separated into a plurality of separate substrates, and wherein the perforations are formed along the entire circumference of the resulting individual substrates.

10. The method of claim 9, wherein the second predefined lines extend partly along a circumference of the resulting individual substrates but not along the entire circumference of the resulting individual substrates.

11. The method of claim 1, wherein the second thickness is between 50% and 90% of the first thickness.

12. The method of claim 1, wherein the first thickness is between 200 µm and 1000 µm.

* * * * *